United States Patent
Zhang et al.

(10) Patent No.: US 6,709,929 B2
(45) Date of Patent: Mar. 23, 2004

(54) METHODS OF FORMING NANO-SCALE ELECTRONIC AND OPTOELECTRONIC DEVICES USING NON-PHOTOLITHOGRAPHICALLY DEFINED NANO-CHANNEL TEMPLATES

(75) Inventors: Zhibo Zhang, Raleigh, NC (US); Veena Misra, Raleigh, NC (US); Salah M. A. Bedair, Raleigh, NC (US); Mehmet Ozturk, Cary, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 10/178,941

(22) Filed: Jun. 24, 2002

(65) Prior Publication Data

US 2003/0010971 A1 Jan. 16, 2003

Related U.S. Application Data

(60) Provisional application No. 60/300,804, filed on Jun. 25, 2001, and provisional application No. 60/301,018, filed on Jun. 26, 2001.

(51) Int. Cl.[7] .................. H01L 21/336; H01L 21/8238; C25D 11/04
(52) U.S. Cl. .................... 438/268; 206/962; 257/14; 205/324
(58) Field of Search .......................... 438/962, 206, 438/268; 257/14; 205/324

(56) References Cited

U.S. PATENT DOCUMENTS

| | | | |
|---|---|---|---|
| 5,306,661 A | * | 4/1994 | Tonucci et al. ............. 438/494 |
| 5,581,091 A | | 12/1996 | Moskovits et al. |
| 5,880,525 A | | 3/1999 | Boudreau et al. |
| 6,034,468 A | | 3/2000 | Wilshaw |
| 6,044,981 A | * | 4/2000 | Chu et al. .................... 210/490 |
| 6,177,291 B1 | * | 1/2001 | Eriguchi et al. ............. 438/42 |
| 6,231,744 B1 | | 5/2001 | Ying et al. |
| 6,359,288 B1 | | 3/2002 | Ying et al. |

FOREIGN PATENT DOCUMENTS

EP 0 178 831 B1 8/1991

OTHER PUBLICATIONS

Nitayama et al. "Multi–Pillar SGT for Compact and High–Speed Circuits". IEEE Trans. E. Dev. 38 (3), 1991. pp. 579–583.*

Auth, Christopher P., "Scaling Theory for Cylindrical, Fully–Depleted, Surrounding–Gate MOSFET's," IEEE Electron Device Letters, vol. 18, No. 2, Feb. 1997, pp. 74–76.

(List continued on next page.)

*Primary Examiner*—John F. Niebling
*Assistant Examiner*—Viktor Simkovic
(74) *Attorney, Agent, or Firm*—Myers Bigel Sibley & Sajovec

(57) ABSTRACT

Methods of forming a nano-scale electronic and optoelectronic devices include forming a substrate having a semiconductor layer therein and a substrate insulating layer on the semiconductor layer. An etching template having a first array of non-photolithographically defined nano-channels extending therethrough, is formed on the substrate insulating layer. This etching template may comprise an anodized metal oxide, such as an anodized aluminum oxide (AAO) thin film. The substrate insulating layer is then selectively etched to define a second array of nano-channels therein. This selective etching step preferably uses the etching template as an etching mask to transfer the first array of nano-channels to the underlying substrate insulating layer, which may be thinner than the etching template. An array of semiconductor nano-pillars is then formed in the second array of nano-channels. The semiconductor nano-pillars in the array may have an average diameter in a range between about 8 nm and about 50 nm. The semiconductor nano-pillars are also preferably homoepitaxial or heteroepitaxial with the semiconductor layer.

22 Claims, 8 Drawing Sheets

OTHER PUBLICATIONS

Choi et al., "Ultra–thin Body SOI MOSFET for Deep–sub-tenth Micron Era," Department of Electrical Engineering and Computer Sciences, University of California at Berkeley, No Date, 3 pages.

Hisamoto et al., "A Folded–channel MOSFET for Deepsub-tenth Micron Era," Department of Electrical Engineering and Computer Sciences, University of California at Berkeley, 1998 IEEE, 3 pages.

Hisamoto et al., "A Fully Depleted Lean–channel Transistor (DELTA), "1989 IEEE, pp. 34.5.1—34.5.4.

Li et al., "On the Growth of Highly Ordered Pores in Anodized Aluminum Oxide, "Chem. Mater. 1998, vol. 10, pp. 2470–2480.

Masuda et al, "Highly ordered nanochannel–array architecture in anodic alumina," Appl. Phys. Lett. 71, Vo.19, Nov. 10, 1997, pp. 2770–2772.

Risch et al., "Vertical MOS Transistors with 70nm Channel Length," IEEE Transaction on Electron Devices, vol. 43, No. 9, Sep. 1996, pp. 1495–1498.

Leobandung et al., "Wire–channel and wrap–around–gate metal–oxide–semiconductor field–effect transistors with a significant reduction of short channel effects," J. Vac. Sci. Technol. B 15(6), Nov./Dec. 1997, pp. 2791–2794.

Yang et al., "25–nm p–Channel Vertical MOSFET's with SiGeC Source–Drains, " IEEE Electron Device Letters, vol. 20, No. 6, Jun. 1999, pp. 301–303.

Backman et al., "Polarized Light Scattering Spectroscopy for Quantitative Measurement of Epithelial Cellular Structures *In Situ*, " IEEE Journal of Selected Topics in Quantum Electronics., vol. 5, No. 4, Jul./Aug. 1999, pp. 1019–1026.

Chen et al., "0.18 $\mu$m Metal Gate Fully–Depleted SOI MOSFETs for Advanced CMOS Applications," 1999 Symposium on VLSI Technology Digest of Technical Papers, pp. 25–26.

Fafard et al., "Lasing in quantum–dot ensembles with sharp adjustable electronic shells, " Applied Physics Letters, vol. 75, No. 7, Aug. 16, 19999, pp. 986–988.

Fafard et al., "Red–Emitting Semiconductor Quantum Dot Lasers," 2003 AAAS Annual Meeting Newsroom, Feb. 13–18, 2002, 15 pages.

Faist et al., "Mid–infrared field–tunable intersubband electroluminescence at room temperature by photonassisted tunneling in coupled–quantum wells," Appl. Phys. Lett., vol. 64, No.9, Feb. 28, 1994, pp. 1144–1146.

Guha et al., "Selective area metalorganic molecular–beam epitaxy of GaN and the growth of luminescent microcolumns on Si/SioO2," Applied Physics Letter, vol. 75, No. 4, Jul. 26,1999, pp. 463–465.

Hergenrother et al., "The Vertical Replacement–Gate (VRG) MOSFET: A 50–nm Vertical MOSFET with Lithography-Independent Gate Length," 1999 IEEE, pp. IEDM 99–75 through 99–78.

Hinzer et al., "Widely tunable self–assembled quantum dot lasers," J. Vac. Sci. Technol. A, vol. 18, No. 2, Mar./Apr. 2000, pp. 578–581.

Huffacker et al., "Quantum dot vertical–cavity surface–emitting laser with a dielectric aperture," Applied Physics Letters, vol. 70, No. 18, May 5, 1997, pp. 2356–2358.

Jones et al., "Strained–Layer InGaAs–GaAs–InGaP Buried-Heterostructure Quantum–Well Lasers on a Low–Compostition InGaAs Substrate by Selective–Area MOCVD," IEEE Photonics Technology Letters, vol. 20, No. 4, Apr. 1998, pp. 489–491.

Kent, Popularity of laser eye surgery grows in BC, Can Med Assoc J, vol. 158, No. 2, Jan. 27, 1998, pp. 161.

Levi, "Researchers Vie to Achieve a Quantum–Dot Laser," Physics Today, May 1996, pp. 22–24.

Meindl, "Low Power Microelectronics: Retrospect and Prospect,"Proceedings of the IEEE., vol. 83, No. 4, Apr. 1995, pp. 619–635.

Misra et al., "Electric Properties of Composite Gate Oxides Formed by Rapid Thermal Processing," IEEE Transactions on Electron Devices, vol. 43, No. 4, Apr. 1996, pp. 636–646.

Montgomery, "Annual Technology Forecast, FIfty years of fiber optics," Lightwave Special Reports, Dec. 1999, pp. 49–54.

Nam et al., "Lateral epitaxy of low defect density GaN layers via organometalliv vapor phase epitaxy," Applied Physics Letters, vol. 71, No. 18, Nov. 3, 1997, pp. 2638–2640.

Nitayama et al., "Multi–Pillar SurroundingGate Tansistor (M–SGT) for Compact and High–Speed Circuits, " IEEE Transactions of Electron Devices, vol. 38, No. 3, Mar. 1991, pp. 579–583.

Pan et al., "Normal–incidence intersubband (In, Ga)As/ GaAs quantum dot infrared photodetectors," Applied Physics Letters, vol. 73, No. 14, Oct. 5, 1998, pp. 1937–1939.

Perelman et al., "Observation of Periodic Fine Structure in Reflectance from Biological Tissue: A New Technique for Measuring Nuclear Size Distribution, " Physical Review Letters, vol. 80, No. 3, Jan. 19, 1998, pp. 627–630.

Rogers et al., "Low threshold voltage continuous wave vertical–cavity surface–emitting lasers, " Applied Physics Letters, vol. 62, 1993, pp. 2027–2029.

Sarlet et al., "Control of Widely Tunable SSG–DBR Lasers for Dense Wavelength Division Multiplexing," Journal of Lightwave Technology, vol. 18, No. 8, Aug. 2000, pp. 1128–1138.

Ventkatesan et al., "A High Performance 1.8V, 0.20 $\mu$m CMOS Technology with Copper Metallization," 1997 IEEE, pp. IEDM 97–769 through 97–772.

Wong et al., "Device Design Considerations for Double- –Gate, Ground–Plane, and Single–Gated Ultra–Thin SOI MOSFET's at the 25 nm Channel Length Generation," 1998 IEEE, pp. IEDM 98–407 through 98–410.

Wong et al., "Nanoscale CMOS," Proceeding of the IEEE, vol. 87, No. 4, Apr. 1999, pp. 537–570.

Wong et al., "Self–Aligned (Top and Bottom) Double–Gate MOSFET with a 25nm Thick Silicon Channel," 1997 IEEE, pp. IEDM 97–427 through 97–430.

Zhang et al., Magnetotransport investigations of ultrafine single–crystalline bismuth nanowire arrays, Applied Physics Letters, vol. 73, No. 11, Sep. 14, 1998, pp. 1589–1591.

\* cited by examiner

METHODS OF FORMING NANO-SCALE ELECTRONIC AND OPTOELECTRONIC DEVICES USING NON-PHOTOLITHOGRAPHICALLY DEFINED NANO-CHANNEL TEMPLATES

REFERENCE TO PRIORITY APPLICATIONS

This application claims priority to Provisional Application Ser. Nos. 60/300,804, filed Jun. 25, 2001 and 60/301,018, filed Jun. 26, 2001, the disclosures of which are hereby incorporated herein by reference.

GOVERNMENT RIGHTS

This invention was made with Government support under Contract No. N66001-01-1-8977, awarded by SPAWAR/DARPA. The Government may have certain rights in this invention.

FIELD OF THE INVENTION

The present invention relates to methods of forming integrated circuit devices and device formed thereby and, more particularly, to methods of forming integrated circuit devices having nano-scale features therein and integrated circuit devices formed thereby.

BACKGROUND OF THE INVENTION

As semiconductor devices scale down to nano-scale dimensions (i.e., $\leq 100$ nm features), the performance improvements predicted by Moore's Law typically diminish. Some fundamental physical properties, such as direct quantum tunneling through gate dielectrics, poly depletion in gate electrodes and source-drain leakage due to short channel effects, may become limiting factors in performance and may inhibit further scaling of conventional devices.

One method to suppress short channel effects in field effect transistors is to make the semiconductor channel of the transistor sufficiently thin that it becomes fully depleted during operation. One such device is a planar thin-body semiconductor-on-insulator (SOI) transistor, where the source-drain leakage current can be controlled by a high quality back oxide. However, the thin-body SOI transistor may suffer from poor drain-induced barrier lowering and significant short channel threshold voltage reduction due to reach-through of the drain field through a bulk oxide region. The dual-gate MOSFET with both a front gate and a back gate can provide an effective solution to the problems encountered by thin-body SOI transistors. An extension of the dual-gate transistor is the surround gate transistor, which includes a gate that wraps around (i.e., surrounds) the channel.

Several double/surround gate devices that have been proposed can be classified as either horizontal devices or vertical devices. In horizontal devices, the gate length can be defined using photolithography techniques. However, conventional photolithography techniques may not efficiently scale to nano-scale dimensions. In vertical devices, conventional photolithography techniques may not be required to achieve nano-scale dimensions. For example, in vertical field effect transistors, the gate length and other features may be defined by film thickness instead of a photolithographically defined line width. Conventional vertical devices, such as surround gate transistors, are disclosed in an article by E. Leobandung et al. entitled "Wire-Channel and Wrap-Around-Gate Metal-Oxide-Semiconductor Field-Effect Transistors with a Significant Reduction of Short Channel Effects," J. Vac. Sci. Technol., B 15(6), pp. 2791–2794, November/December (1997). Vertical devices are also disclosed in an article by C. Auth et al., entitled "Scaling Theory for Cylindrical, Fully-Depleted, Surrounding-Gate MOSFET's," IEEE Elec. Dev. Lett., Vol. 18, No. 2, pp. 74–76, February (1997).

Additional devices that utilize nano-scale metal or semiconductor materials may be formed using nanowires. When wires fabricated from metal or semiconductor materials are provided in the nanometer size range, some of the electronic and optical properties of the metal or semiconductor materials at nano-scale dimensions may be different from the same properties of the same materials at a larger scale. Semiconductor structures in the nanometer size range that exhibit the characteristics of quantum confinement are typically referred to as zero-dimension (OD) quantum dots or more simply as quantum dots when the confinement is in three dimensions. Quantum dots may be provided by semiconductor materials having one or more dimensions on the scale of about ten nanometers or less. When quantum confinement is in two dimensions, the structures are typically referred to as one-dimensional quantum wires or more simply as quantum wires. A quantum wire is a wire having a diameter sufficiently small to cause confinement of an electron gas in directions that extend normal to the wire.

A prior art technique for fabricating quantum wires may utilize a micro-photolithographic process followed by a metalorganic chemical vapor deposition (MOCVD) process. This technique may be used to generate a single quantum wire or a row of gallium arsenide (GaAs) quantum wires embedded within a bulk aluminum arsenide (AlAs) substrate. However, such techniques may not be compatible with processes to form two or three dimensional arrays of nanowires in which the spacing between nanowires is relatively small and uniform.

Additional techniques for forming two-dimensional arrays of nano-channels include filling naturally occurring arrays of nano-channels or nanopores in a substrate with a material of interest. In this manner, the substrate is used as a template. Exemplary substrates include anodic aluminum oxide and mesoporous materials, which may be provided with arrays of pores therein. In particular, U.S. Pat. No. 6,359,288 to Ying et al. discloses techniques for forming arrays of nanowires in anodic aluminum oxide substrates. One of these techniques includes systematically changing the channel diameter and channel packing density of an anodic aluminum oxide layer by anodizing an aluminum layer with an electrolyte to provide an anodic aluminum oxide layer having nanopores therein. The mean pore diameter is disclosed as varying by no more than 100% along the length of the pore. The '288 patent also discloses filling the pores with single crystal material so that the resulting nanowires constitute single crystal quantum wires. These quantum wires may have an average wire diameter in a range of about 1 nm to about 20 nm. U.S. Pat. No. 6,231,744 to Ying et al. also discloses a method of forming a nanowire array by anodizing an aluminum substrate using an acidic electrolyte solution to provide a porous aluminum oxide film (i.e., anodic aluminum oxide (AAO) film) on a surface of an aluminum substrate. The porous AAO film is then exposed to an acid etchant solution for a period of time sufficient to enlarge the cell size of the pores.

Techniques for forming porous films and nano-scale electronic devices are disclosed in European Patent Specification No. EP 0 178 831 B1 and in U.S. Pat. No. 6,034,468 to Wilshaw. In particular, the '468 patent to Wilshaw discloses a field emitter device having a dielectric AAO layer therein with nanopores. The front ends of the wires constitute individual field emitting cathodes. A gate electrode is also provided on a front surface of the AAO layer. U.S. Pat. No. 5,581,091 to Moskovits et al. also discloses single-electron devices that are useful as diodes and transistors. These devices are prepared by anodizing a metal substrate in an acid bath to convert the metal substrate into an oxide film.

SUMMARY OF THE INVENTION

Embodiments of the present invention include nano-scale electronic devices and methods of forming nano-scale electronic devices using techniques that advantageously have a reduced number of photolithographically defined processing steps. Some of these electronic devices constitute field effect transistors having surround gates that provide fully depleted operation. Other embodiments include opto-electronic devices that contain compound semiconductor materials.

Methods according to embodiments of the present invention include forming a vertical nano-scale electronic device by forming a substrate having a semiconductor layer therein and a substrate insulating layer on the semiconductor layer. The substrate insulating layer may contact an upper surface of the semiconductor layer. A step is then performed to form an etching template having a first array of non-photolithographically defined nano-channels extending therethrough, on the substrate insulating layer. This etching template may comprise an anodized metal oxide, such as an anodized aluminum oxide (AAO) thin film. The substrate insulating layer is then selectively etched to define a second array of nano-channels therein. This selective etching step preferably uses the etching template as an etching mask to transfer the first array of nano-channels to the underlying substrate insulating layer, which may be thinner than the etching template. An array of semiconductor nano-pillars is then formed in the second array of nano-channels. The semiconductor nano-pillars in the array may have an average diameter in a range between about 8 nm and about 50 nm. The semiconductor nano-pillars are also preferably homoepitaxial or heteroepitaxial with the semiconductor layer.

The step of forming an etching template may include forming a metal film (e.g., aluminum film) on the substrate insulating layer and then repeatedly anodizing the metal film to convert it into an anodic metal oxide layer having nano-channels therein. The selective etching step may also include ion etching or reactive ion beam etching the insulating layer for a sufficient duration to penetrate the substrate insulating layer and expose the semiconductor layer. The semiconductor layer may also constitute a monocrystalline semiconductor layer and the step of forming an array of semiconductor nano-pillars may include epitaxially growing monocrystalline semiconductor nano-pillars using the monocrystalline semiconductor layer as a seed layer.

These methods may also include the steps of removing the substrate insulating layer to expose the semiconductor nano-pillars and then implanting dopants of first conductivity type into upper surfaces of the semiconductor nano-pillars to define respective drain regions therein. Gate insulating layers are then formed on sidewalls of the semiconductor nano-pillars. A global surround gate electrode may then be formed that extends on the gate insulating layers and in recesses between the semiconductor nano-pillars. A drain electrode may be formed that contacts the drain regions in the semiconductor nano-pillars.

The step of forming a drain electrode may be preceded by the step of depositing an electrically insulating passivation layer on the surround gate electrode and etching-back the passivation layer to expose the upper surfaces of the semiconducting nano-pillars. The step of implanting dopants may also be preceded by the steps of forming a sacrificial protective layer on upper surfaces and sidewalls of the semiconductor nano-pillars and then etching-back the sacrificial protective layer to expose the upper surfaces of the semiconducting nano-pillars. The sacrificial protective layer may then be removed entirely before the gate insulating layer is formed on sidewalls of the semiconducting nano-pillars.

Additional methods of forming vertical nano-scale electronic devices may include forming a substrate comprising a semiconductor layer, a substrate insulating layer on the semiconductor layer and a barrier metal layer on the substrate insulating layer. An etching template is then formed on the substrate insulating layer. The etching template has a first array of non-photolithographically defined nano-channels or nanopores extending therethrough. The etching template may be formed by depositing a metal film (e.g., aluminum film) on the barrier metal layer and then anodizing the metal film into an anodic metal oxide layer having an array of nanopores therein. The barrier metal layer is then selectively etched so that the nanopores extend through the barrier metal layer and expose the substrate insulating layer. The anodic metal oxide layer and the barrier metal layer collectively form the etching template. The substrate insulating layer is then selectively etched for a sufficient duration to define a second array of nano-channels therein and expose the semiconductor layer. The substrate insulating layer may comprise silicon dioxide or silicon nitride, for example. Other electrically insulating materials may also be used. This etching step is performed in order to transfer the pattern of the first array of nano-channels in the etching template to the underlying substrate insulating layer. Selective growth techniques may then be used to grow an array of semiconductor nano-pillars that extend upward from the semiconductor layer and into the second array of nano-channels.

Methods of forming nano-scale opto-electronic devices are also provided by embodiments of the present invention. These methods may include forming a substrate comprising a first compound semiconductor layer of first conductivity type that is a composite of first and second III–V semiconductor materials (e.g., GaAs and AlGaAs). An electrically insulating layer (e.g., $SiO_2$) is then formed on the first semiconductor layer. A step is performed to form a metal thin film on the electrically insulating layer. The metal thin film is converted into an anodized metal oxide layer having an array of nanopores therein. This step to convert the metal thin film into an anodized metal oxide layer is preferably performed without using a photolithographically defined mask to guide the conversion process. The array of nanopores within the anodized metal oxide layer is then transferred to the electrically insulating layer. An array of vertical quantum-dot superlattices is epitaxially grown upward from the underlying first semiconductor layer, using the array of nanopores to guide the epitaxial growth step. A second compound semiconductor layer of second conductivity type may be formed on the array of vertical quantum-dot superlattices. This second compound semiconductor layer may comprise a composite of the first and second III–V semiconductor materials, for example.

Additional embodiments of the present invention include preferred optoelectronic devices that contain arrays of vertical quantum-dot superlattices therein. An optoelectronic device may include a substrate having a first III–V semiconductor layer therein. An electrically insulating layer is also provided that extends on the first III–V semiconductor layer. This electrically insulating layer includes an array of non-photolithographically defined nanopores therein. An array of vertical quantum-dot superlattices are provided in the array of nanopores. These vertical quantum-dot superlattices are electrically coupled to the first III–V semiconductor layer. The optoelectronic device may also include a second III–V semiconductor layer that extends on the array of vertical quantum-dot superlattices. According to a preferred aspect of this embodiment, the first and second III–V semiconductor layers are homoepitaxial or heteroepitaxial with the vertical quantum-dot superlattices.

DESCRIPTION OF PREFERRED EMBODIMENTS

Figure 1:
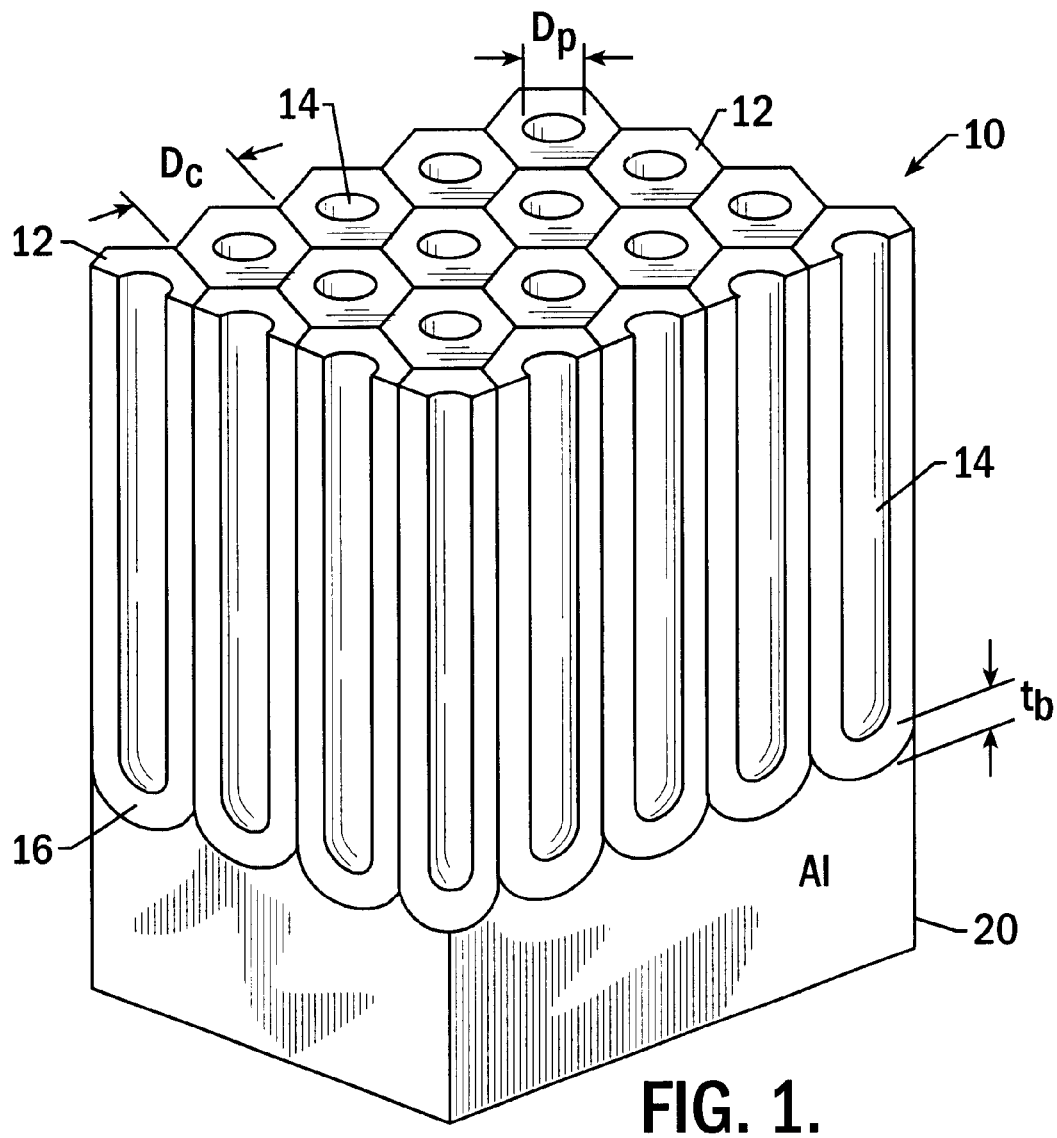
FIG. 1 is a perspective view of an anodic aluminum oxide layer that may be formed by method embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well.

Methods of forming self-assembled nanoporous anodic aluminum oxide thin films according to embodiments of the present invention will now be described. As illustrated best by FIG. 1, a nanoporous anodic aluminum oxide (AAO) thin film 10 may include an array of hexagonal-shaped columnar cells 12 having respective nanopores 14 therein that may also be referred to herein as "nano-channels." Each of the cells 12 is illustrated as having a diameter "$D_c$" that may be in a range between about 25 nm and about 400 nm and each of the nanopores 14 may have a diameter "$D_p$" in a range between about 8 nm and about 50 nm. The bottom of the nanopores 14 may be separated from an underlying aluminum substrate 20 by an anodic aluminum oxide barrier layer 16. The anodic aluminum oxide barrier layer 16 typically has a thickness "$t_b$" in a range between about 10 nm and about 150 nm. As described more fully hereinbelow, the AAO thin film 10 may be formed by repeatedly exposing the aluminum substrate 20 to an anodization process that may be integrated within an electrochemical batch process.

These methods of forming nanoporous AAO thin films 10 according to embodiments of the present invention may include initial steps to mechanically polish an aluminum (Al) substrate 20. The mechanical polishing step may include using a diamond paste (e.g., 3 µm) and a silica (~20 nm) aqueous suspension within a conventional polishing tool. The aluminum substrate 20 is preferably a high purity (e.g., 99.997% Al) substrate that has been treated under a high pressure press (e.g., ~1×10$^6$ psi) to flatten the substrate 20 prior to polishing. The aluminum substrate 20 may then be thermally annealed in an N$_2$ ambient at a temperature of about 350° C. for about 1 hour to promote grain growth and achieve a relatively large average grain size (e.g., 3–5 µm). An annealing temperature of about 400° C. and an annealing time of about 30 minutes may also be used. Annealing times and temperatures that provide similar thermal treatments may also be used.

The aluminum substrate 20 is then exposed to an electrochemical polishing step with a preferred electrolyte at a voltage of about 20 V and a temperature of about 84° C., in some embodiments. The preferred electrolyte may include a solution of H$_3$PO$_4$ (95 vol %), H$_2$SO$_4$ (5 vol %) and CrO$_3$ (20 g/liter). The aluminum substrate 20 is treated repeatedly to an anodization process to improve the uniformity of the AAO thin film 10 and achieve a desired AAO thin film 10 thickness in a gradual manner. Pre-patterning techniques may also be used to improve the uniformity of the AAO. The diameter and length of the nanopores 14 can be controlled by adjusting the electrolyte composition and concentration and the anodization voltage and time.

Figure 2A:
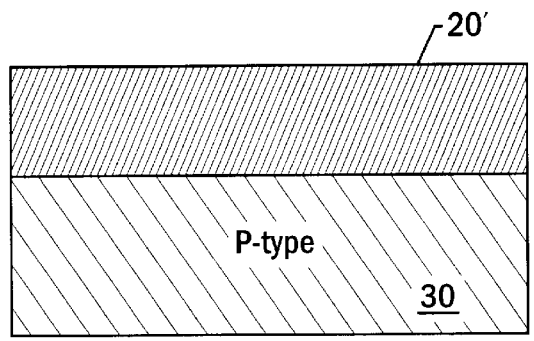
FIGS. 2A–2H are cross-sectional views of intermediate structures that illustrate methods of forming vertical surround gate field effect transistors according to embodiments of the present invention.
Figure 2B:
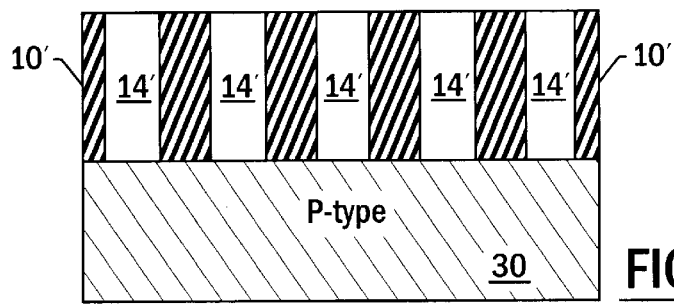

Methods of forming nano-scale field effect transistors according to embodiments of the present invention may utilize the AAO thin films 10 of FIG. 1. In particular, FIGS. 2A–2H illustrate methods of forming N-channel surround gate nano-scale MOSFETs that do not require photolithographically controlled patterning steps to define channel length and gate electrode feature size. In FIG. 2A, a silicon substrate 30 (e.g., P-type) is provided with an aluminum layer 20' thereon. The aluminum layer 20' may have a thickness in a range between about 100 nm and about 5000 nm. A thin barrier layer (not shown) may also be formed on the silicon substrate 30 in order to improve adhesion between the aluminum layer 20' and the silicon substrate 30 and act as a conductive layer to facilitate an anodization process. This barrier layer may include a conductive titanium layer having a thickness of about 5–20 nm. Other conductive materials besides titanium may also be used. The barrier layer may be formed by thermal evaporation or sputtering. As illustrated by FIG. 2B, the aluminum layer 20' is then converted into a nanoporous anodic aluminum oxide (AAO) thin film 10' using, in one exemplary embodiment, the methods described above with respect to FIG. 1. These methods may include a repeated anodization process. The anodization process may be stopped before the entire aluminum layer 20' is converted into aluminum oxide (Al$_2$O$_3$) and any residual aluminum or insulating material (e.g., SiO$_2$) at the bottoms of the nanopores 14' may be removed using an etching step (e.g., ion etching). This etching step may result in exposure of the underlying silicon substrate 30 at the locations defined by the nanopores 14'.

Figure 2C:
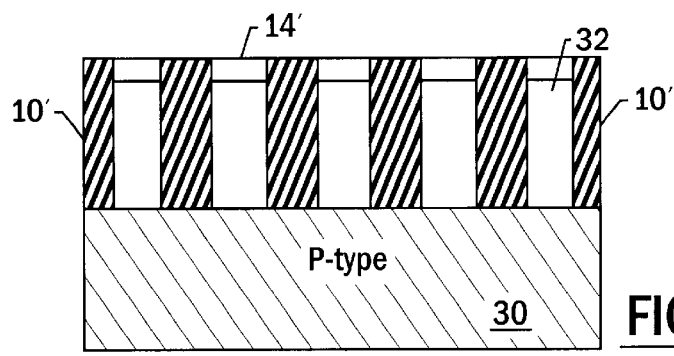

Referring now to FIG. 2C, nano-scale silicon pillars 32 are then formed inside the nanopores 14'. These silicon pillars 32 may be formed as monocrystalline silicon pillars using selective epitaxial growth (SEG) techniques and the exposed portions of the underlying silicon substrate 30 as growth "seeds". The growth of the silicon pillars 32 may include a low temperature (~800° C.) selective epitaxial growth step using an ultra high vacuum rapid thermal chemical vapor deposition process (UHV-CVD), with or without chlorine. Such an epitaxial growth step can be used to produce high quality, facet free silicon pillars 32 having an average diameter in a range between about 8 nm and about 50 nm. The epitaxial growth step may include in-situ doping of the silicon pillars 32 to achieve desired electrical properties. The duration of the epitaxial growth step may be sufficiently long to provide silicon pillars 32 having an average height in a range between about 10 nm and about 100 nm. As explained more fully hereinbelow, the vertical openings defined by the array of nanopores 14' may be transferred to an underlying insulating layer, which can be used as a template for epitaxial growth. In alternative embodiments, the silicon pillars 32 may be formed by depositing a blanket layer of amorphous silicon (a-Si) on an upper surface of the AAO thin film 10' and into the nanopores 14'. The deposited a-Si layer (not shown) may then be planarized using a conventional technique such as chemical-mechanical polishing (CMP). The remaining amorphous silicon pillars within the pores 14' are then recyrstallized using, for example, a solid phase recrystallization process.

Figure 2D:
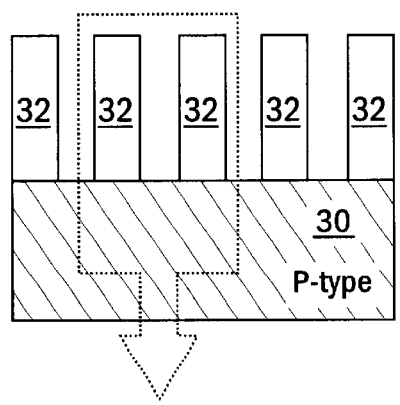
Figure 2E:
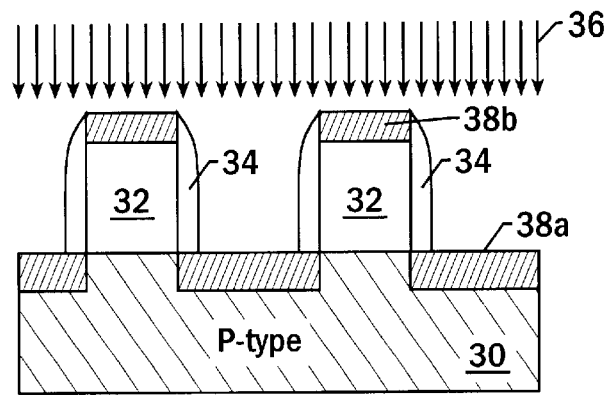

The AAO thin film 10' is selectively removed to expose an array of free-standing silicon pillars 32, as illustrated by FIG. 2D. Referring now to FIG. 2E, which represents an enlarged cross-sectional view of a highlighted portion of the structure illustrated by FIG. 2D, a step is performed to protect sidewalls of the silicon pillars 32. This step may include depositing a blanket layer of an electrically insulating material, such as silicon dioxide or silicon nitride, and then anisotropically etching back the deposited layer to define sidewall spacers 34 that surround the silicon pillars 32 and expose an upper surface of the silicon substrate 30 and upper surfaces of the silicon pillars 32. N-type source and drain region dopants 36 are then implanted into the exposed surfaces, as illustrated. The dopants are thermally activated to define a contiguous mesh-shaped source region 38a in the silicon substrate 30 and also define a plurality of drain regions 38b that extend adjacent upper surfaces of the silicon pillars 32. The protective sidewall spacers 34 may then be removed to expose sidewalls of the silicon pillars 32. In alternative embodiments, the upper surface of the silicon substrate 30 may include a semiconductor layer that is relatively highly doped and need not be exposed to receive source region dopants 36. In these embodiments, the sidewall spacers 34 need not be defined using an etch-back step.

Figure 2F:
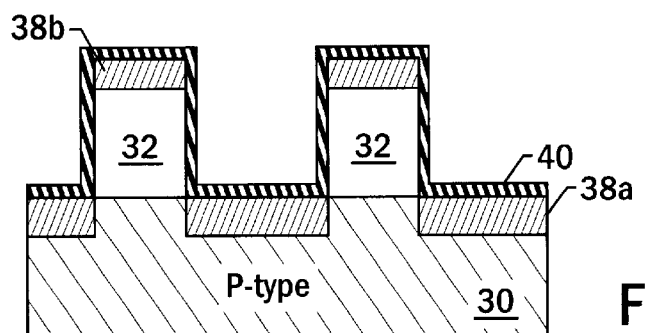
Figure 2G:
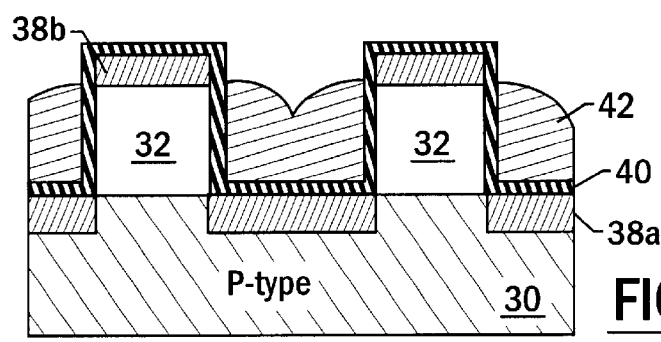
Figure 2H:
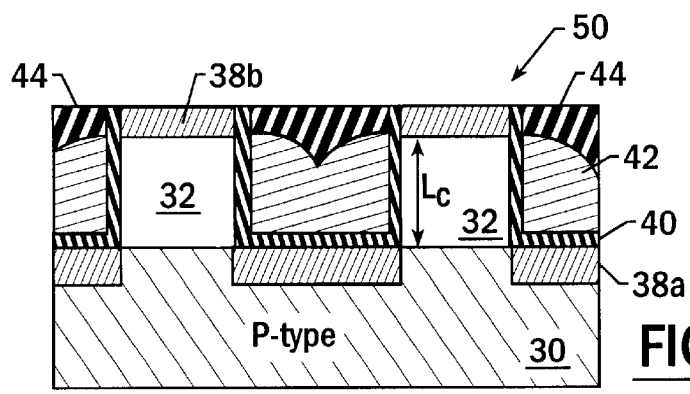

Referring now to FIG. 2F, a conformal gate oxide layer 40 may be formed on the silicon pillars 32 using a thermal oxidation step. Other techniques for depositing a gate oxide layer 40 may also be used. A blanket conductive layer (e.g., polysilicon, metal) may be deposited on the gate oxide layer 40 and etched back to define a polysilicon gate electrode 42 that surrounds the array of silicon pillars 32, as illustrated by FIG. 2G. Because the source and drain regions 38a and 38b are formed before the gate electrode 42, the methods described herein may be compatible with high-K dielectrics and metal gate electrodes materials may be used. As illustrated by FIG. 2H, a blanket electrically insulating passivation layer 44 may then be deposited and planarized to expose the drain regions 38b at the upper surfaces of the silicon pillars 32. In this manner, a vertical surround gate field effect transistor 50 having an overall effective channel width that is proportional to a product of a width of each pillar 32 and the number of pillars 32, can be formed. The channel length "$L_c$" of the transistor is equal to the height of the silicon pillars 32 minus the depth of the drain regions 38b, as illustrated.

Figure 3A:
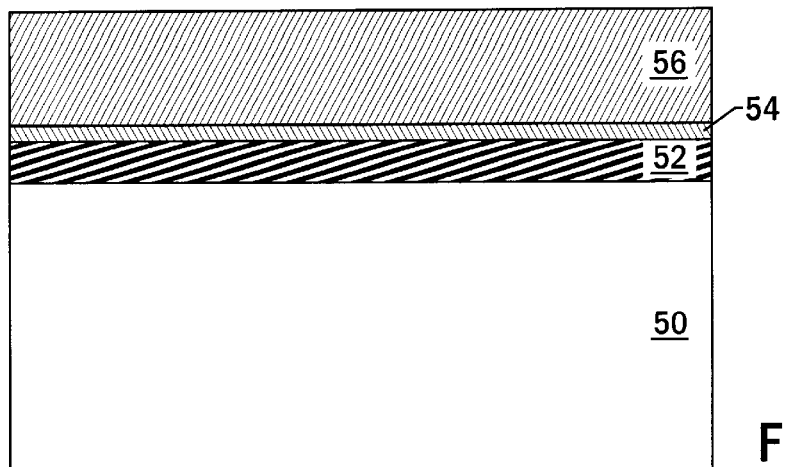
FIGS. 3A–3G are cross-sectional views of intermediate structures that illustrate methods of forming vertical surround gate field effect transistors according to additional embodiments of the present invention.

Additional methods of forming vertical surround gate field effect transistors will now be more fully described with respect to FIGS. 3A–3G. As illustrated by FIG. 3A, the methods include forming a substrate comprising a semiconductor layer 50 and a substrate insulating layer 52 on the semiconductor layer 50. The semiconductor layer 50 may be formed within a semiconductor wafer and may be of first conductivity type (e.g., P-type). In alternative embodiments, the semiconductor layer may be of second conductivity type (e.g., N-type). The substrate insulating layer 52 may comprise a silicon dioxide layer having a thickness in a range between about 10 nm and 200 nm or possible thicker. An etching template is formed on the substrate insulating layer 52. The etching template may be formed by a sequence of steps including thermally evaporating an aluminum layer 56 on the substrate insulating layer 52. Other metals, including aluminum alloys, may also be used. The aluminum layer 56 may have a thickness in a range between about 100 nm and about 5 $\mu$m in some embodiments. The step of forming the aluminum layer 56 may be preceded by an optional step of forming a barrier layer 54 directly on the substrate insulating layer 52. The barrier layer 54 may be formed by thermally evaporating a metal layer (e.g., titanium) onto an upper surface of the substrate insulating layer 52. The barrier layer 54 may have a thickness in a range between about 5 nm and about 20 nm in some embodiments and may be used as a conductive layer to facilitate anodization of the aluminum layer 56. The barrier metal layer 54 may also be used to promote adhesion between the substrate insulating layer 52 and the aluminum layer 56. As described above with respect to FIGS. 2A–2H, the aluminum layer 56 may be thermally annealed to promote grain growth and electrochemically polished to prepare the surface of the aluminum layer 56 for subsequent processing steps.

Figure 3B:
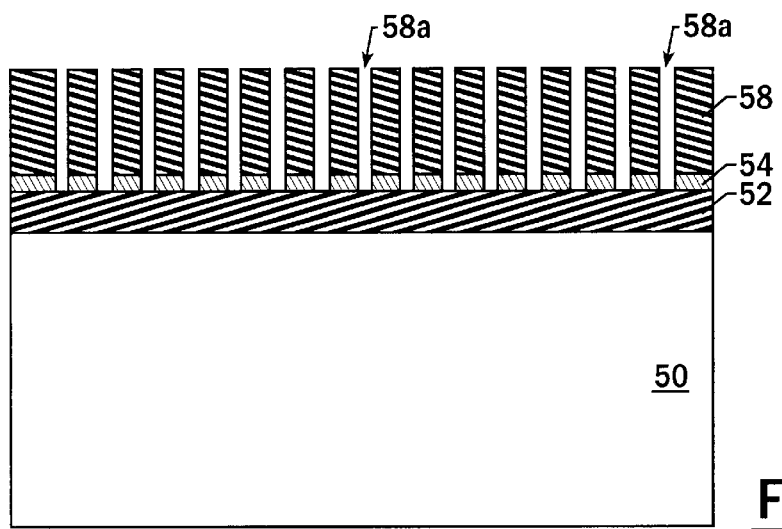

As illustrated by FIG. 3B, additional steps to form the etching template may include repeatedly anodizing the aluminum layer 56 to convert it into an anodic aluminum oxide (AAO) layer 58 having a naturally occurring (and non-photolithographically defined) array of nanopores or nanochannels 58a therein. These nanopores 58a extend substantially through the entire thickness of the AAO layer 58 (see, e.g., FIG. 1). Residual aluminum metal at the bottoms of the nanopores 58a may be removed using a conventional etching step. The array of nanopores 58a may also be transferred to the underlying barrier metal layer 54 using a selective etching step (e.g., reactive ion-beam etching). The duration of this selective etching step should be sufficient to fully penetrate the barrier metal layer 54 and expose an upper surface of the underlying substrate insulating layer 52.

Figure 3C:
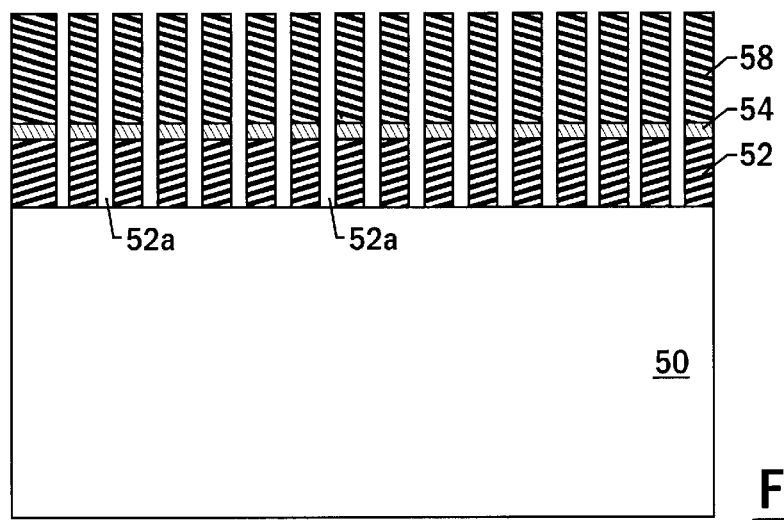

Referring now to FIG. 3C, the array of nanopores 58a is advantageously transferred from the etching template to the underlying substrate insulating layer 52 by selectively etching the substrate insulating layer 52 using the etching template (58, 54) as an etching mask. This selective etching step results in the formation of a second array of nanopores 52a that extend through the substrate insulating layer 52. This selective etching step may include ion etching or reactive ion beam etching the substrate insulating layer 52. A cleaning step may also be performed using a high vacuum cleaning technique or by exposing the substrate insulating layer 52 to a HF cleaning solution. The etching template (58, 54) is then removed to expose the substrate insulating layer 52.

Figure 3D:
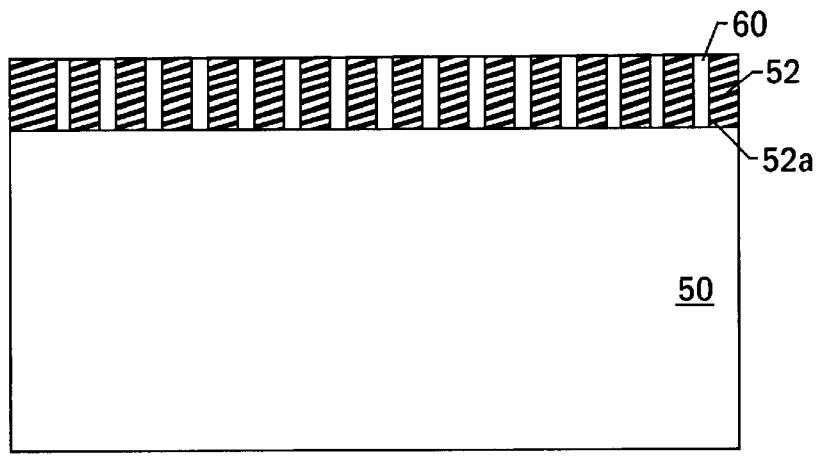
Figure 3E:
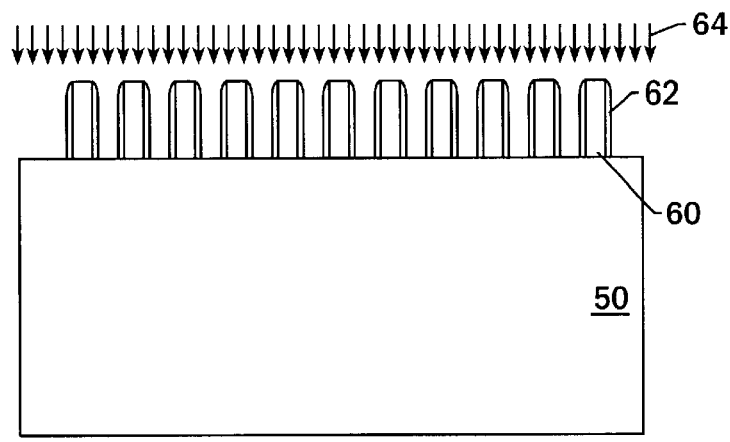

Referring now to FIG. 3D, an array of semiconductor nano-pillars 60 may be formed in the second array of nanopores 52a by selectively epitaxially growing monocrystalline pillars 60 into the nanopores 52a using the underlying semiconductor layer 50 as a seed layer. According to a preferred aspect of these embodiments, the substrate insulating layer 52 may be considerably thinner than the etching template (58, 54) in order to reduce the aspect ratio (height/diameter) of the nanopores 52a that are used to confine the array of semiconductor nano-pillars 60 and improve the efficiency of the selective epitaxial growth step. After the selective growth step, the substrate insulating layer 52 is selectively removed to expose the array of semiconductor nano-pillars 60. Conventional steps may then be used to define sidewall insulating spacers 62 on sidewalls of the nano-pillars 60, as illustrated by FIG. 3E. These conventional steps may include depositing a blanket passivation layer (not shown) on the nano-pillars 60 and then anisotropically etching back the blanket insulating layer to expose the semiconductor layer 50 and upper surfaces of the nano-pillars 60. Source and drain region dopants 64 are then implanted into the nano-pillars 60 and the underlying substrate layer 50, using the sidewall insulating spacers 62 as an implant mask.

Figure 3F:
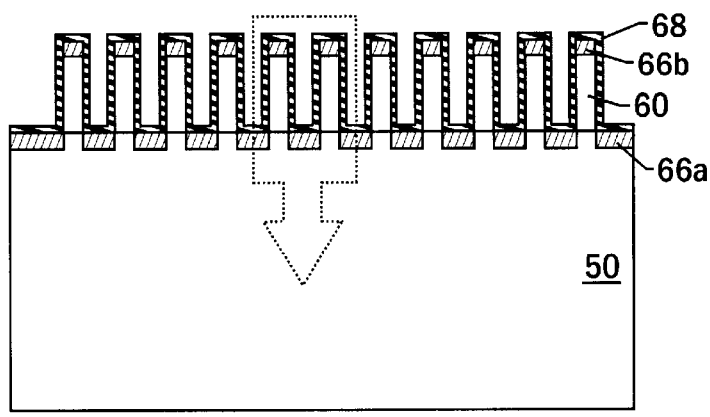
Figure 3G:
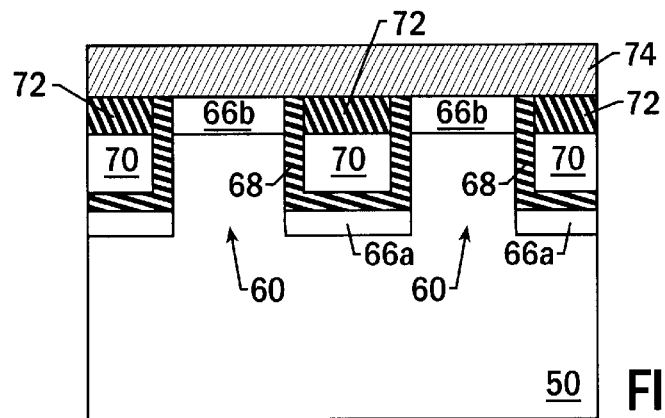

The implanted dopants 64 are then activated and driven-in to define a contiguous mesh-shaped source region 66a in the semiconductor layer 50 and a plurality of drain regions 66b in the nano-pillars 60. The sidewall insulating spacers 62 are then removed using an etching step. A conventional thermal oxidation step may then be performed to define a gate oxide insulating layer 68 on the sidewalls of the nano-pillars 60, as illustrated by FIG. 3F. Referring now to FIG. 3G, which represents an enlarged cross-sectional view of the highlighted portion of FIG. 3F, a blanket conductive layer (e.g., polysilicon layer) is deposited onto the semiconductor layer 50 and then etched back to define a mesh-shaped surround gate 70 that extends between the nano-pillars 60. A passivation layer 72 may then be deposited to fill recesses between the nano-pillars 60 and cover the surround gate 70. The passivation layer 72 is then planarized to expose the drain regions 66b. This step may be followed by the step of depositing a layer of metallization, which operates as a drain electrode 74. A source electrode may also be formed in ohmic contact with the contiguous source region 66a at a remote location (not shown).

Figure 4A:
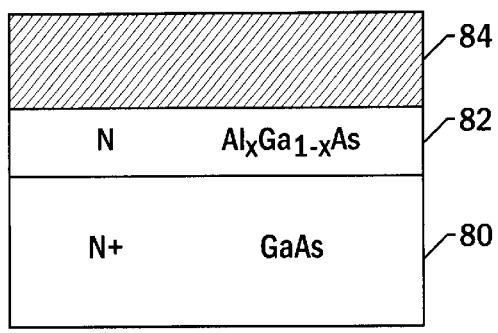
FIGS. 4A–4D are cross-sectional views of intermediate structures that illustrate methods of forming opto-electronic devices according to embodiments of the present invention.

Methods of forming opto-electronic devices according to embodiments of the present invention will now be described with reference to FIGS. 4A–4D. These methods may utilize a variety of III–V (or II–VI) compound semiconductor materials to define opto-electronic light emitting and/or light detecting devices including, but not limited to, semiconductor lasers, light emitting diodes (LEDs) and photodetectors. As illustrated by FIG. 4A, an N-type $Al_xGa_{1-x}As$ layer 82 may be grown on an underlying compound semiconductor substrate 80, which is shown as an N+ gallium arsenide (GaAs) substrate. The $Al_xGa_{1-x}As$ layer 82 may be grown on the compound semiconductor substrate 80 using a conventional metal-organic chemical vapor deposition (MOCVD) process or a molecular beam epitaxy (MBE) process, for example. An aluminum metal layer 84 is then formed on the $Al_xGa_{1-x}As$ layer 82. The aluminum metal layer 84 may be formed using a physical vapor deposition (PVD) process, including evaporation or sputtering. This deposition process may be preceded by the deposition of a protective insulating layer (e.g., $SiO_2$) on the $Al_xGa_{1-x}As$ layer 82. The aluminum metal layer 84 may also be provided as an epitaxial layer that is formed by continuing the step of epitaxially growing the $Al_xGa_{1-x}As$ layer 82 on the underlying compound semiconductor substrate 80 and gradually reducing the concentration of the gallium (Ga) and arsenic (As) source elements. In the event a PVD process is used, the deposited aluminum metal layer 84 can be thermally annealed to promote grain size growth, as described above.

Figure 4B:
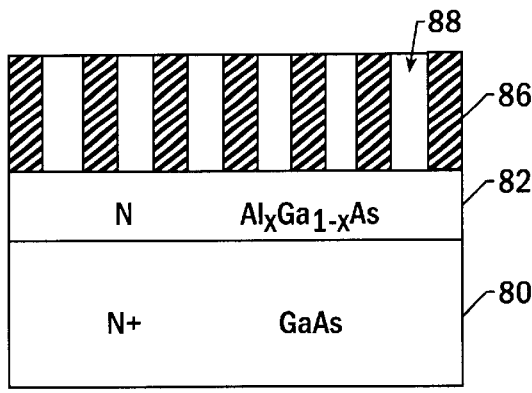

Referring now to FIG. 4B, the aluminum metal layer 84 is then subjected to a repeated anodization process to convert the aluminum metal layer 84 into an anodized aluminum oxide (AAO) layer 86 having a closely-packed highly regular array of nanopores 88 therein. These nanopores may have an average diameter in a range between about 10 nm and about 100 nm. The diameter and density of these nanopores 88 may be controlled by adjusting the electrolyte composition and concentration and the anodization voltage and time. Various electrolytes, such as oxalic acid, sulfuric acid and phosphoric acid can be used to obtain AAO layers with desired dimensions.

Figure 4C:
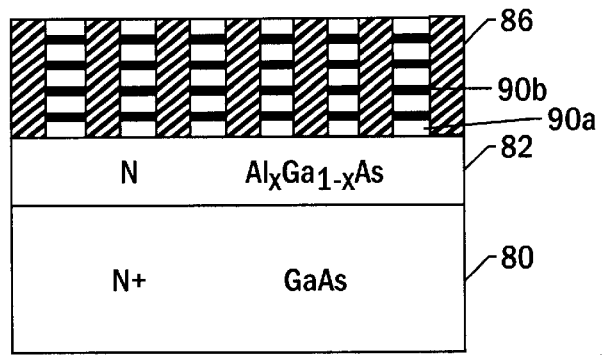
Figure 4D:
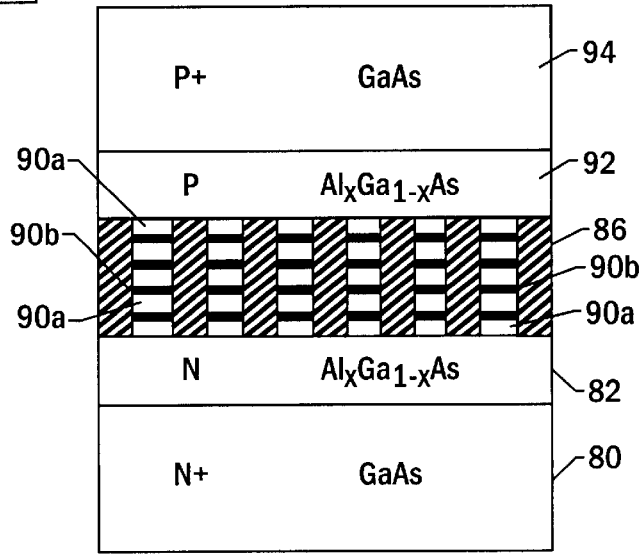

Referring now to FIG. 4C, a vertical stack of InGaAs/GaAs quantum dots can be selectively grown inside the nanopores 88 of the AAO layer 86. These quantum dots are illustrated as a vertical stack of alternating InGaAs dots 90a and GaAs dots 90b. A selective growth technique that provides a high degree of selectivity to $Al_xGa_{1-x}As$ over $Al_2O_3$ may be used to efficiently form the vertical stack of quantum dots. In some embodiments, these quantum dots 90a/90b are grown to completely fill the nanopores 88 in the AAO layer 86, as illustrated. Following the steps to grow the quantum dots within the nanopores 88, an $Al_xGa_{1-x}As$ layer 92 (shown as P-type) can be deposited on the AAO layer 86, as illustrated by FIG. 4D. Conventional techniques may then be used to deposit a GaAs cladding layer 94 (shown as P+) on the $Al_xGa_{1-x}As$ layer 92.

Figure 5A:
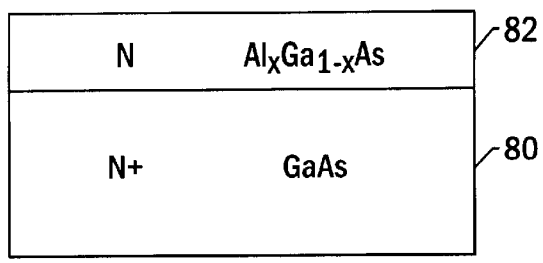
FIGS. 5A–5F are cross-sectional views of intermediate structures that illustrate methods of forming opto-electronic devices according to additional embodiments of the present invention.
Figure 5B:
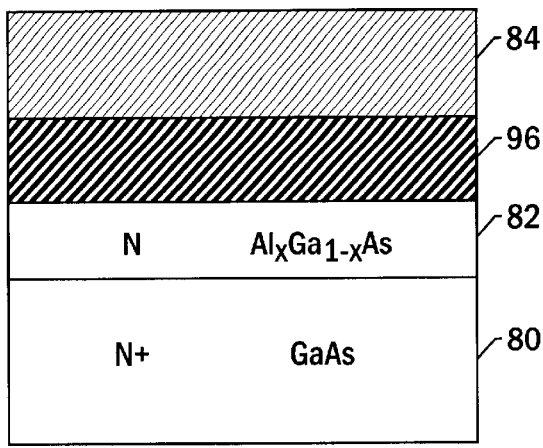

An alternative method of forming a similar device to the optoelectronic device of FIG. 4D may utilize an electrically insulating layer (e.g., $SiO_2$) as a porous growth template having a carefully controlled thickness that matches a height of a desired vertical stack of quantum dots 90a/90b. This method includes growing an N-type $Al_xGa_{1-x}As$ layer 82 on an underlying compound semiconductor substrate 80, as illustrated by FIG. 5A. The compound semiconductor substrate 80 is shown as an N+ gallium arsenide (GaAs) substrate. A silicon dioxide layer 96 or other acceptable insulating material layer is then deposited on the $Al_xGa_{1-x}As$ 82, as illustrated by FIG. 5B. The step of depositing the silicon dioxide layer 96 may be followed by a step to form a barrier metal layer (e.g., titanium barrier layer) on the silicon dioxide layer 96. An aluminum metal layer 84 is then formed on the silicon dioxide layer 96 (or barrier metal layer). The aluminum metal layer 84 may be formed using a physical vapor deposition process (PVD), including evaporation or sputtering.

Figure 5C:
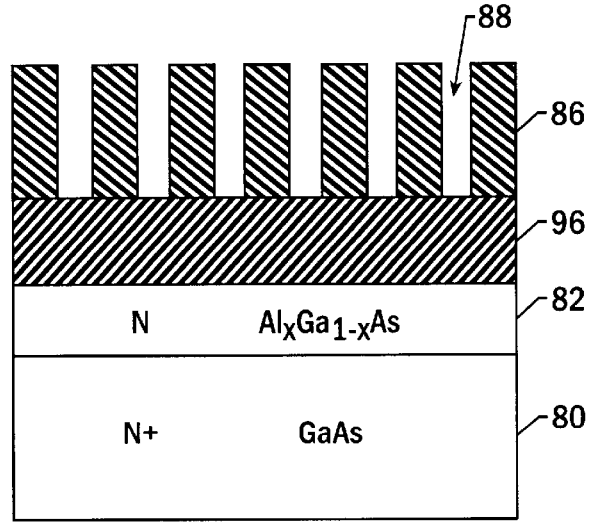
Figure 5D:
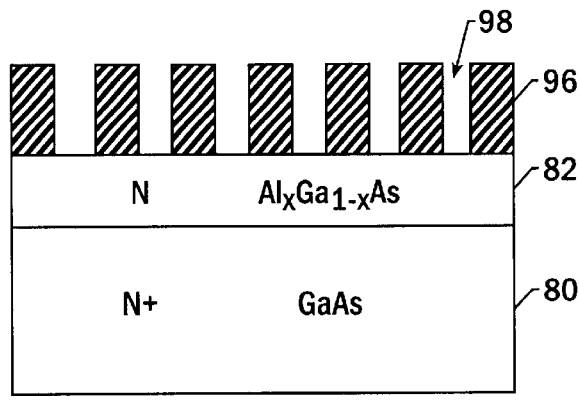
Figure 5E:
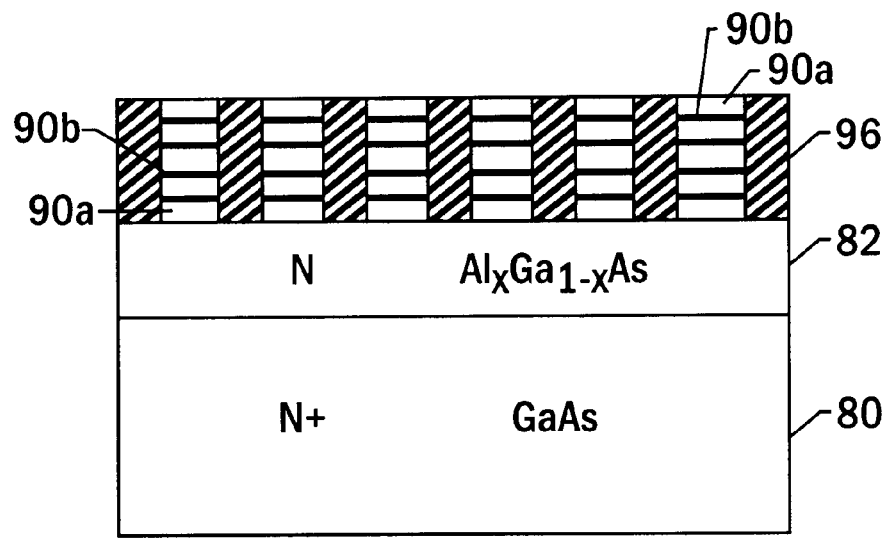
Figure 5F:
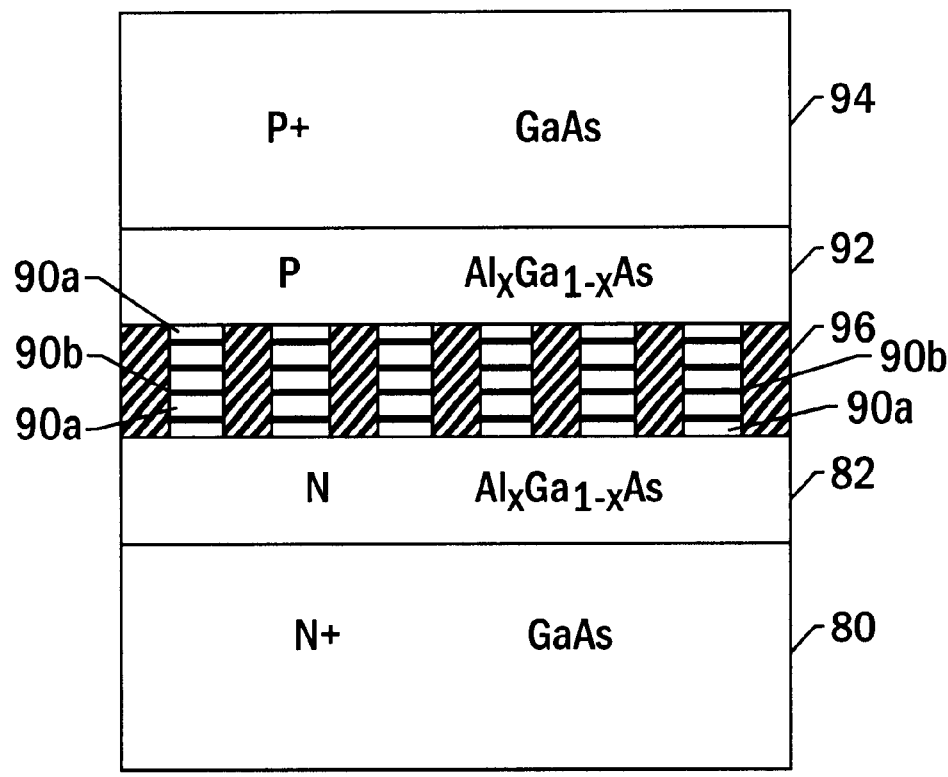

Referring now to FIG. 5C, the aluminum metal layer 84 is subjected to a repeated anodization process to convert the aluminum metal layer 84 into an anodized aluminum oxide (AAO) layer 86 having a closely-packed highly regular array of nanopores 88 therein. Referring now to FIG. 5D, the silicon dioxide layer 96 may be selectively etched using the anodized aluminum oxide layer 86 as an etching mask. This selective etching step results in a transfer of the array of nanopores 88 in the AAO layer 86 to the underlying silicon dioxide layer 96. As illustrated by FIGS. 5D–5E, a vertical stack of InGaAs/GaAs quantum dots can be selectively grown inside the transferred array of nanopores 98. These dots are illustrated as a vertical stack of alternating InGaAs dots 90a and GaAs dots 90b. A selective growth technique that provides a high degree of selectivity to $Al_xGa_{1-x}As$ over SiO$_2$ may be used to efficiently form the vertical stack of quantum dots. In some embodiments, these quantum dots 90*a*/90*b* are grown to completely fill the transferred array of nanopores 98 in the silicon dioxide layer 96. Following the steps to grow the quantum dots, an Al$_x$Ga$_{1-x}$As layer 92 (shown as P-type) can be deposited on the silicon dioxide layer 96, as illustrated in FIG. 5F. Conventional techniques may then be used to deposit a GaAs cladding layer 94 (shown as P+) on the Al$_x$Ga$_{1-x}$As layer 92 in the event these layers are necessary to complete the opto-electronic device.

In some laser structures, ohmic contacts can be made to the N+GaAs substrate 80 and the P+ GaAs cladding layer 94 and a cavity can be formed by conventional cutting or cleaving. The lateral size distribution of the vertical quantum dot stack can also be controlled by the channel diameter of the AAO thin film 86. Moreover, because the height distribution of the quantum dots may be controlled at an atomic level and because the heights may be substantially smaller than the diameter of the dots (i.e., pallet shaped), any performance degradation caused by diameter variation can be made less significant. The lateral coupling of the quantum dots can be treated as negligible because of the wide bandgap of the insulating material between the channels (Al$_2$O$_3$ or SiO$_2$).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a vertical nano-scale electronic device, comprising the steps of:
    forming a substrate comprising a semiconductor layer and a substrate insulating layer on the semiconductor layer;
    forming an etching template having a first array of non-photolithographically defined nano-channels extending therethrough, on the substrate insulating layer;
    selectively etching the substrate insulating layer to define a second array of nano-channels therein, using the etching template as an etching mask; and
    forming an array of semiconductor nano-pillars that extend in the second array of nano-channels and have an average diameter in a range between about 8 nm and about 50 nm.

2. The method of claim 1, wherein said step of forming an etching template comprises forming a nanoporous anodic aluminum oxide thin film on the substrate insulating layer.

3. The method of claim 1, wherein said step of forming an etching template comprises:
    forming a metal film on the substrate insulating layer; and
    anodizing the metal film into an anodic metal oxide layer.

4. The method of claim 1, wherein said selectively etching step comprises ion etching or reactive ion etching the substrate insulating layer for a sufficient duration to penetrate the substrate insulating layer.

5. The method of claim 1, wherein said selectively etching step comprises ion etching or reactive ion etching the substrate insulating layer for a sufficient duration to penetrate the substrate insulating layer and expose the semiconductor layer.

6. The method of claim 5, wherein the semiconductor layer is a monocrystalline semiconductor layer; and wherein said step of forming an array of semiconductor nano-pillars comprises epitaxially growing monocrystalline semiconductor nano-pillars in the second array of nano-channels.

7. A method of claim 6, further comprising the steps of:
    removing the substrate insulating layer to expose sidewalls of the semiconductor nano-pillars;
    implanting dopants of first conductivity type into upper surfaces of the semiconductor nano-pillars to define respective drain regions therein;
    forming gate insulating layers on the sidewalls of the semiconductor nano-pillars;
    forming a gate electrode that extends on the gate insulating layers and in recesses between the semiconductor nano-pillars; and
    forming a drain electrode that electrically contacts the drain regions in the semiconducting nano-pillars.

8. The method of claim 7, wherein said step of forming a drain electrode is preceded by the steps of:
    depositing an electrically insulating passivation layer on the gate electrode; and
    etching-back the passivation layer to expose the upper surfaces of the semiconducting nano-pillars.

9. The method of claim 7, wherein said implanting step is preceded by the steps of:
    forming a sacrificial protective layer on upper surfaces and sidewalls of the semiconductor nano-pillars; and
    etching-back the sacrificial protective layer to expose the upper surfaces of the semiconducting nano-pillars.

10. The method of claim 9, wherein said step of forming gate insulating layers is preceded by the step of removing the sacrificial protective layer.

11. The method of claim 7, wherein said implanting step is preceded by the steps of:
    forming a sacrificial protective layer on upper surfaces and sidewalls of the semiconductor nano-pillars; and
    etching-back the sacrificial protective layer to expose the upper surfaces of the semiconductor nano-pillars and expose portions of the underlying substrate.

12. The method of claim 11, wherein said step of forming gate insulating layers is preceded by the step of removing the sacrificial protective layer.

13. The method of claim 12, wherein said implanting step comprises implanting dopants of first conductivity type into the upper surfaces of the semiconductor nano-pillars and the exposed portions of the substrate to define drain and source regions therein.

14. A method of claim 1, further comprising the steps of:
    removing the substrate insulating layer to expose sidewalls of the semiconductor nano-pillars;
    implanting dopants of first conductivity type into upper surfaces of the semiconductor nano-pillars to define respective drain regions therein;
    forming gate insulating layers on the sidewalls of the semiconductor nano-pillars;
    forming a gate electrode that extends on the gate insulating layers and in recesses between the semiconductor nano-pillars; and
    forming a drain electrode that electrically contacts the drain regions in the semiconducting nano-pillars.

15. A method of forming a vertical nano-scale electronic device, comprising the steps of:
    forming a substrate comprising a semiconductor layer, a substrate insulating layer on the semiconductor layer and a barrier metal layer on the substrate insulating layer;
    forming an etching template having a first array of non-photolithographically defined nano-channels extending therethrough, on the substrate insulating layer;

selectively etching the substrate insulating layer for a sufficient duration to define a second array of nano-channels therein, using the etching template as an etching mask; and forming an array of semiconductor nano-pillars that extend in the second array of nano-channels.

16. The method of claim 15, wherein said step of forming an etching template comprises:

forming a metal film on the barrier metal layer;

anodizing the metal film into an anodic metal oxide layer: and etching the barrier metal layer using the anodic metal oxide layer as an etching mask.

17. A method of forming a vertical nano-scale electronic device, comprising the steps of:

forming a substrate comprising a semiconductor layer and a non-aluminum barrier metal layer on the semiconductor layer;

forming an anodic aluminum oxide layer having an array of nano-sized pores therein, on the barrier metal layer;

selectively etching portions of the barrier metal layer extending adjacent bottoms of the nano-sized pores, using the anodic aluminum oxide layer as an etching mask; and forming an array of semiconductor nano-pillars that extend in the nano-sized pores.

18. A method of forming a vertical nano-scale opto-electronic device, comprising the steps of:

forming a substrate comprising a first compound semiconductor layer of first conductivity type that is a composite of first and second III–V semiconductor materials;

forming an electrically insulating layer on the first compound semiconductor layer;

forming a metal thin film on the electrically insulating layer;

converting the metal thin film to an anodized metal oxide layer having an array of nanopores therein;

transferring the array of nanopores in the anodized metal oxide layer into the electrically insulating layer;

epitaxially growing an array of vertical quantum-dot superlattices in the array of nanopores in the electrically insulating layer; and forming a second compound semiconductor layer of second conductivity type that is a composite of the first and second III–V semiconductor materials, on the array of vertical quantum-dot superlattices.

19. A method of forming a vertical nano-scale field effect transistor, comprising the steps of:

forming an electrically insulating layer having an array of nanopores therein;

forming an array of monocrystalline semiconductor nano-pillars in the array of nanopores;

forming a plurality of drain regions in the semiconductor nano-pillars; and forming a gate electrode that at least partially surrounds the semiconductor nano-pillars.

20. A method of forming a vertical nano-scale opto-electronic device, comprising the steps of:

forming a substrate comprising a first compound semiconductor layer of first conductivity type that is a composite of first and second III–V semiconductor materials;

forming an anodized metal oxide layer having an array of nanopores therein, on the first compound semiconductor layer;

epitaxially growing an array of vertical quantum-dot superlattices in the array of nanopores, using the first compound semiconductor layer as a seed layer; and forming a second compound semiconductor layer of second conductivity type that is a composite of the first and second III–V semiconductor materials, on the array of vertical quantum-dot superlattices.

21. The method of claim 20, wherein said step of forming an anodized metal oxide layer comprises epitaxially growing an aluminum metal layer on the first compound semiconductor layer.

22. The method of claim 21, wherein the first compound semiconductor layer comprises $Al_xGa_{1-x}As$.

* * * * *